(12) United States Patent
Komatsu

(10) Patent No.: US 8,055,125 B2
(45) Date of Patent: Nov. 8, 2011

(54) SUBSTRATE STAGE MECHANISM AND SUBSTRATE PROCESSING APPARATUS

(75) Inventor: Tomohito Komatsu, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 862 days.

(21) Appl. No.: 11/995,611

(22) PCT Filed: Jul. 11, 2006

(86) PCT No.: PCT/JP2006/313754
§ 371 (c)(1),
(2), (4) Date: Apr. 4, 2008

(87) PCT Pub. No.: WO2007/007744
PCT Pub. Date: Jan. 18, 2007

(65) Prior Publication Data
US 2009/0123140 A1 May 14, 2009

(30) Foreign Application Priority Data
Jul. 14, 2005 (JP) .................. 2005-205717

(51) Int. Cl.
*F26B 19/00* (2006.01)
(52) U.S. Cl. ...................... 392/418; 392/407
(58) Field of Classification Search .......... 392/407, 392/418
See application file for complete search history.

(56) References Cited

U.S. PATENT DOCUMENTS
2003/0180034 A1  9/2003 Saito et al.

FOREIGN PATENT DOCUMENTS

| JP | 62 59984 | 3/1987 |
|---|---|---|
| JP | 7 272834 | 10/1995 |
| JP | 2001 237051 | 8/2001 |
| JP | 2001 327051 | 8/2001 |
| JP | 2001 250858 | 9/2001 |
| JP | 2003 215964 | 7/2003 |
| JP | 2003 289024 | 10/2003 |
| JP | 2003 297534 | 10/2003 |
| JP | 2004 71172 | 3/2004 |

OTHER PUBLICATIONS

International Search Report issued Oct. 17, 2006 in PCT/JP06/313754 filed Jul. 11, 2006.

*Primary Examiner* — Thor Campbell
(74) *Attorney, Agent, or Firm* — Oblon, Spivak, McClelland, Maier & Neustadt, L.L.P.

(57) ABSTRACT

A substrate stage mechanism (10) configured to place a substrate (W) thereon inside a process container of a substrate processing apparatus (100) and having a substrate heating function for heating the substrate (W) includes a substrate table (11) including a base body (11a) configured to place the substrate (W) thereon and a heating element (13) provided to the base body (11a) and configured to heat the substrate (W); a support member (12) having an upper end connected to the substrate table (11) and a lower end attached to the process container; and a heating device (17) configured to heat the support member (12).

20 Claims, 5 Drawing Sheets

SUBSTRATE STAGE MECHANISM AND SUBSTRATE PROCESSING APPARATUS

TECHNICAL FIELD

The present invention relates to a substrate stage mechanism including a substrate heating function for heating a substrate placed thereon, such as a semiconductor substrate, inside a process container of a substrate processing apparatus, such as a film forming apparatus. The present invention further relates to a substrate processing apparatus that employs the substrate stage mechanism.

BACKGROUND ART

In the sequence of manufacturing semiconductor devices, a vacuum process, such as a CVD film forming process or plasma etching process, is performed on a target substrate or semiconductor wafer. During such a process, the target substrate or semiconductor wafer is heated by a substrate table serving as a heater, so that the semiconductor wafer is set at a predetermined temperature.

As a heater of this kind, a stainless heater is conventionally used, but, in recent years, there has been proposed use of a ceramic heater, which is corrosion-resistant relative to halogen family gases used in the processes described above and has a high thermal efficiency (Patent Document 1 and so forth). The ceramic heater includes a heating element made of a refractory metal and embedded in a base body made of a compacted ceramic sintered body, such as AlN, which serves as a table for placing a target substrate thereon.

Where a substrate table comprising a ceramic heater is used in a substrate processing apparatus, the bottom of the substrate table is connected to one end of a support member formed of a ceramic cylinder, while the other end of the support member is connected to the bottom of a chamber. Electric feed lines for feeding electricity to the heating element are disposed in the support member and connected to terminals of the heating element. A power supply is externally disposed to feed electricity through the electric feed lines and electric feed terminals to the heating element.

A substrate table comprising a ceramic heater includes electric feed terminals near the junction to the support member, and thus the heating element inevitably has a lower density at this portion. Further, at the junction of the substrate table to the support member, heat can be discharged by thermal conduction through the support member. Consequently, cool spots (portions having a lower temperature than the portions around them) are generated around the junction of the substrate table, and thermal stress concentration occurs at these portions and brings about cracks near the junction with a considerable frequency. If the temperature around the junction is increased by the heating element embedded in the substrate table to solve this problem, the temperature distribution on the substrate mount face of the substrate table is less optimized to the process.

Patent Documents 2 and 3 disclose techniques for relaxing the thermal stress at the junction thereby preventing crack generation, but these techniques require complicate shaping mainly for the support member. Further, in recent years, along with an increase in the size of semiconductor wafers, the size of substrate tables have also increased. This trend makes it less effective to rely on the shape of the support member in relaxing the thermal stress, and thus makes it difficult to reliably prevent crack generation.

[Patent Document 1]
Jpn. Pat. Appln. KOKAI Publication No. 7-272834
[Patent Document 2]
Jpn. Pat. Appln. KOKAI Publication No. 2001-250858
[Patent Document 3]
Jpn. Pat. Appln. KOKAI Publication No. 2003-289024

DISCLOSURE OF INVENTION

An object of the present invention is to provide a substrate stage mechanism, which can reliably prevent crack generation at a position between a substrate table and a support member while maintaining a suitable temperature distribution on the substrate mount face of the substrate table.

Another object of the present invention is to provide a substrate processing apparatus that employs the substrate stage mechanism.

According to a first aspect of the present invention, there is provided a substrate stage mechanism configured to place a substrate thereon inside a process container of a substrate processing apparatus and having a substrate heating function for heating the substrate, the substrate stage mechanism comprising: a substrate table including a base body configured to place the substrate thereon and a heating element provided to the base body and configured to heat the substrate; a support member having one end connected to the substrate table and another end attached to the process container; and a heating device configured to heat the support member.

According to a second aspect of the present invention, there is provided a substrate processing apparatus comprising: a process container configured to accommodate a substrate and hold a vacuum pressure therein; a substrate stage mechanism disposed inside the process container and configured to place the substrate thereon; and a process mechanism configured to perform a predetermined process on the substrate inside the process container, wherein the substrate stage mechanism comprises a substrate table including a base body configured to place the substrate thereon and a heating element provided to the base body and configured to heat the substrate, a support member having one end connected to the substrate table and another end attached to the process container, and a heating device configured to heat the support member.

In either of the first aspect and the second aspect, the heating device may be configured to heat the support member by radiation. The heating device may be configured to heat an area near a junction between the substrate table and the support member. The support member may be tubular, and the heating device may be disposed inside the support member.

The heating device may comprise a heater including a carbon wire serving as a heating element and sealed inside a quartz glass tube. The heating device may include a halogen lamp. The heating device may be configured to heat the support member by thermal conduction. In this case, the heating device may comprise a resistance heating heater.

The support member may be connected to a central portion of the substrate table. The substrate stage mechanism may further comprise a control device configured to control the heating device to heat an area near the junction in accordance with temperature of the substrate table.

According to the present invention, the heating device is disposed to heat the support member that supports the substrate table, so that the support member is heated by the heating device while the substrate is heated by the substrate table, to prevent heat from being discharged from the substrate table to the support member. Consequently, the junction between the substrate table and the support member can be free from thermal stress, thereby reliably preventing crack generation at the junction. Further, the heating device for heating and preventing heat discharge from the substrate table is independent of the heating element for heating the substrate. Consequently, the heating of the heating element can be optimized to maintain a suitable temperature distribution on the mount face of the substrate table.

BEST MODE FOR CARRYING OUT THE INVENTION

An embodiment of the present invention will now be described with reference to the accompanying drawings.

In this embodiment, an explanation will be given of a case where a substrate stage mechanism according to the present invention is applied to a CVD film forming apparatus.

Figure 1:
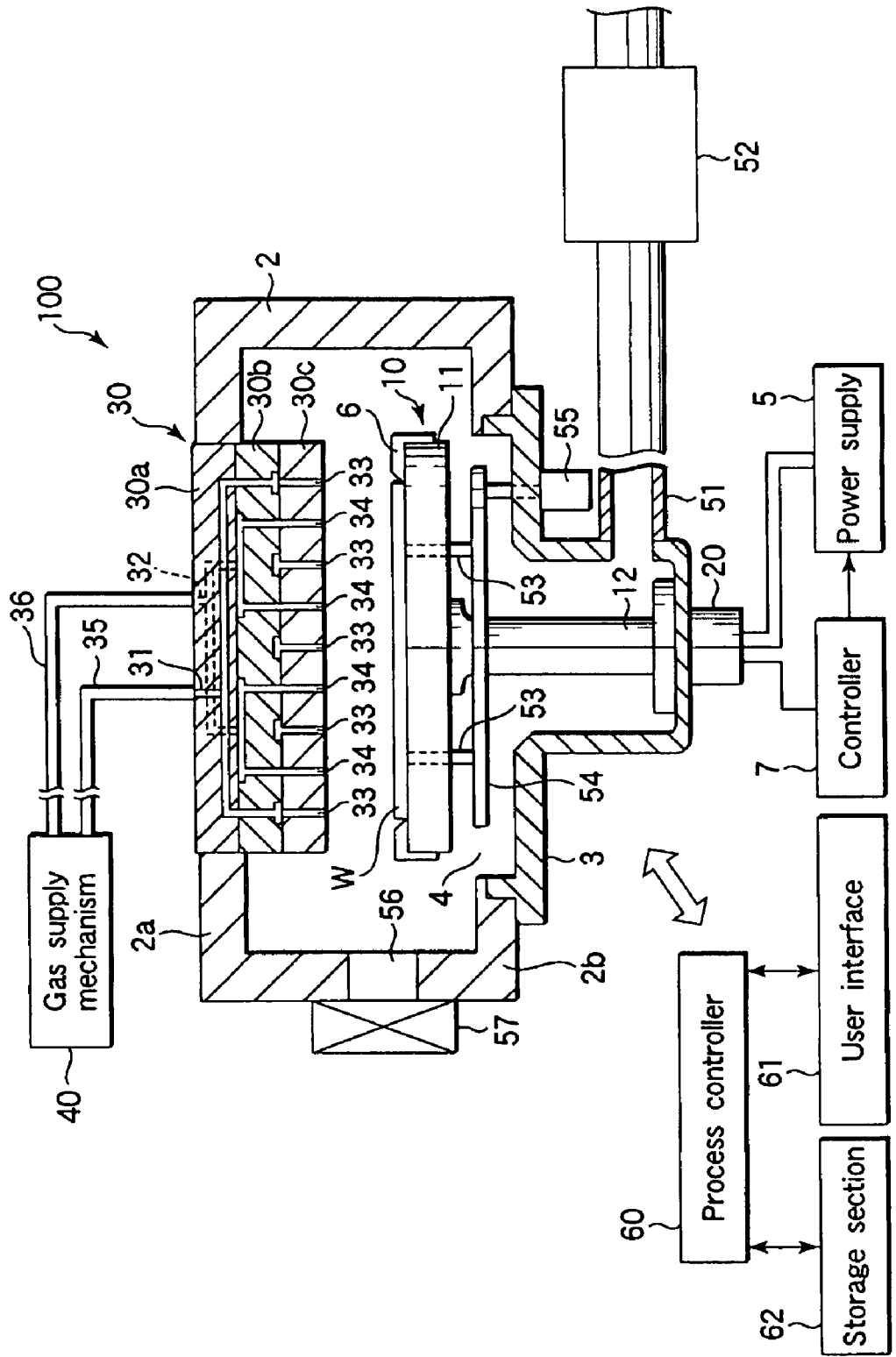
[FIG. 1] This is a sectional view schematically showing a CVD film forming apparatus including a wafer stage mechanism according to an embodiment of the present invention.

FIG. 1 is a sectional view schematically showing a CVD film forming apparatus including a wafer stage mechanism according to an embodiment of the present invention. The CVD film forming apparatus 100 includes an essentially cylindrical airtight chamber 2 and an exhaust chamber 3 projected downward from the bottom wall 2b of the chamber 2, such that the chamber 2 and exhaust chamber 3 form an integral process container. The chamber 2 is provided with a wafer stage mechanism 10 disposed therein for supporting and heating a target object or semiconductor wafer (which will be simply referred to as wafer) W in a horizontal state. The wafer stage mechanism 10 includes a wafer table 11 having a wafer mount face and a heating element embedded therein as described later, and a cylindrical support member 12 extending upward from the bottom of the exhaust chamber 3 of the process container and supporting the center of the wafer table 11. A power supply 5 for feeding electricity to the heating element of the wafer table 11 and so forth is disposed outside the chamber 2, so that electricity is supplied through a connector casing 20 to the heating element and so forth. The power supply 5 is connected to a controller 7 configured to control the amount of electricity supplied from the power supply 5, so that the temperature of the wafer table 11 and so forth is controlled. This control system will be explained in detail later. Further, the wafer table 11 is provided with a guide ring 6 disposed on the edge to guide the wafer W.

A showerhead 30 is disposed on the ceiling wall 2a of the chamber 2. The showerhead 30 is formed of an upper block body 30a, a middle block body 30b, and a lower block body 30c. A first gas feed port 31 and a second gas feed port 32 are formed in the upper surface of the upper block body 30a. On the other hand, gas delivery holes 33 and 34 are alternately formed in the lower block body 30c.

The first and second gas feed ports 31 and 32 are respectively connected to gas supply lines 35 and 36 extending from a gas supply mechanism 40. For example, the gas supply mechanism 40 is configured to supply $TiCl_4$ gas and $NH_3$ gas respectively through the gas supply lines 35 and 36 and the first gas feed port 31 and second gas feed port 32 into the showerhead 30. Then, these gases are independently supplied through gas passages formed in the block bodies, and then delivered respectively from the gas delivery holes 33 and 34. In other words, a post mix type is adopted such that the gas introduced from the first gas feed port 31 and the gas introduced from second gas feed port 32 are not mixed inside the showerhead 30, but delivered from different gas delivery holes 33 and 34 and then mixed.

A circular opening 4 is formed at the center of the bottom wall 2b of the chamber 2, and the exhaust chamber 3 is disposed to cover the opening 4 and project downward. The sidewall of the exhaust chamber 3 is connected to an exhaust unit 52 through an exhaust line 51. The exhaust unit 52 can be operated to decrease the inner pressure of the chamber 2 to a predetermined vacuum level.

The wafer table 11 is provided with three wafer support pins 53 (only two of them are shown in FIG. 1) that can project and retreat relative to the surface of the wafer table 11 to support the wafer W and move it up and down. The wafer support pins 53 are fixed to a support plate 54 and are moved up and down along with the support plate 54 by a driving mechanism 55, such as an air cylinder.

The chamber 2 has a transfer port 56 formed in the sidewall and provided with a gate valve 57 for opening/closing the transfer port 56, so that the wafer W is transferred between the chamber 2 and a transfer chamber (not shown) held in a vacuum state, through the transfer port 56.

Figure 2:
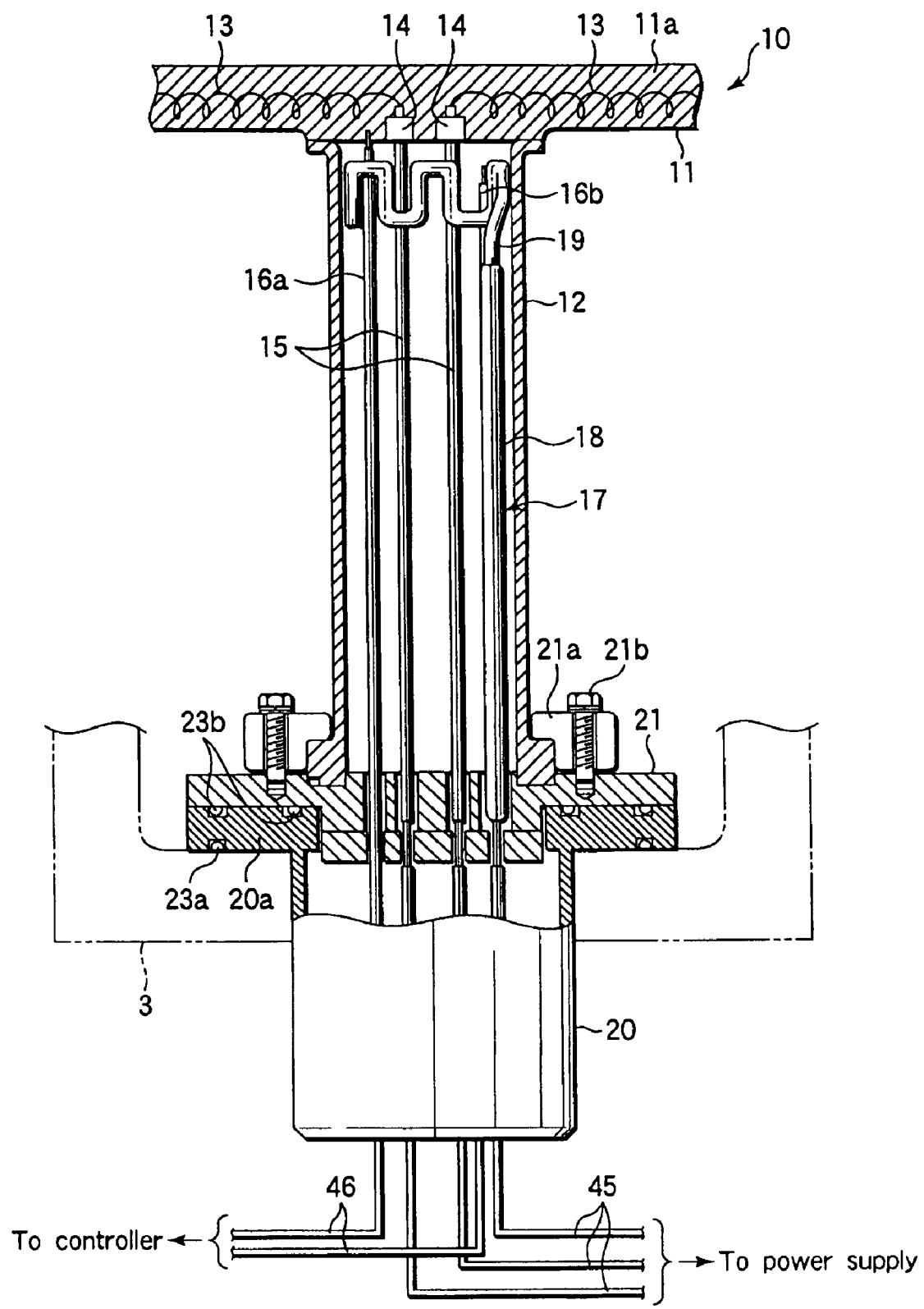
[FIG. 2] This is an enlarged sectional view showing the wafer stage mechanism according to the embodiment of the present invention, in an enlarged state.

Next, a detailed explanation will be given of the wafer stage mechanism 10, with reference to the enlarged sectional view shown in FIG. 2.

As described above, the wafer stage mechanism 10 includes the wafer table 11 and the cylindrical support member 12 that supports the wafer table 11. The wafer table 11 is structured as a ceramic heater, which includes a base body 11a made of a ceramic material, such as AlN, $Al_2O_3$, SiC, or $SiO_2$, and a heating element 13 embedded in the base body 11a and made of a refractory metal, such as W, Mo, V, Cr, Mn, Nb, or Ta, or a compound thereof. The heating element 13 is formed of two zones, and these two zone parts of the heating element 13 are connected to electric feed terminals 14 for feeding electricity, at the central portion of the wafer table 11. Each of the two zone parts of the heating element 13 is provided with two terminals 14, but FIG. 2 shows only one terminal 14 for each of the two zone parts of the heating element 13, i.e., shows totally only two terminals 14, for the sake of convenience.

The support member 12 is also made of a ceramic material, such as AlN, $Al_2O_3$, SiC, or $SiO_2$, as in the wafer table 11, and is connected to the central portion of the bottom of the wafer table 11. The support member 12 envelops four electric feed rods 15 (only two of them are shown in FIG. 2) extending in the vertical direction. The upper ends of the electric feed rods 15 are connected to the electric feed terminals 14, and the lower ends thereof are extended into the connector casing 20, which is attached to the bottom of the support member 12 and is projected downward from the exhaust chamber 3. The electric feed rods 15 are made of a heat-resistant metal material, such as an Ni alloy.

The support member 12 further envelops two thermo couples 16a and 16b extending in the vertical direction. The upper end of the thermo couple 16a is embedded in the wafer table 11, and the upper end of the thermo couple 16b is disposed at the upper end of the support member 12. The lower ends of the thermo couples 16a and 16b are extended into the connector casing 20. The thermo couple 16a is configured to detect the temperature of the wafer table 11, and is used for feedback control of the temperature of the wafer. The thermo couple 16b is used for control of the temperature of a carbon heater, as described later.

Figure 3:
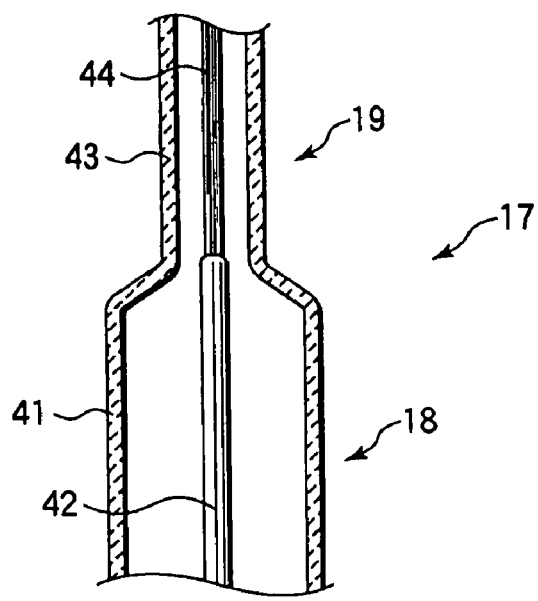
[FIG. 3] This is a sectional view showing the structure of a carbon heater used as a heating device of a support member in the wafer stage mechanism according to the embodiment of the present invention.
Figure 4:
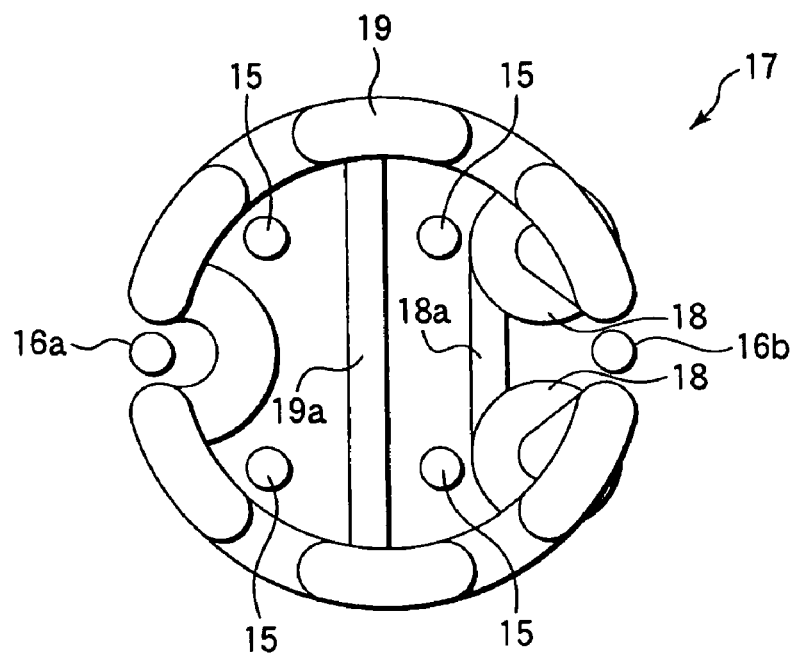
[FIG. 4] This is a plan view showing the carbon heater.

The support member 12 further envelops a carbon heater 17 serving as a heating device for heating the support member 12. The carbon heater 17 includes two (see FIG. 4) electric feed portions 18 extending in the vertical direction inside the support member 12 and a heating portion 19 connected to the distal ends of the electric feed portions 18. As shown in FIG. 3, each of the electric feed portions 18 includes a quartz glass tube 41 and an electric feed rod 42 extending in the tube 41. The heating portion 19 includes a quartz glass tube 43 having a diameter smaller than that of the quartz glass tube 41 of the electric feed portions 18 and a carbon wire 44 extending in the tube 43 and serving as a heating element connected to the electric feed lines. As shown in FIG. 2 and the plan view of FIG. 4, the heating portion 19 is bent up and down and circulated inside an upper side of the support member 12 so as not to interfere with the electric feed rods 15 and thermo couples 16a and 16b. With this arrangement, an area near the junction between the wafer table 11 and support member 12 can be effectively and uniformly heated. The two electric feed portions 18 are interlocked with each other by a support rod 18a. The heating portion 19 is supported by a support rod 19a extending across the diameter in parallel with the support rod 18a. The support rods 18a and 19a serve to prevent the carbon heater 17 from being deformed.

A flange-like bottom lid 21 made of an insulator is attached to the bottom of the support member 12 by an attachment 21a and screws 21b. The bottom lid 21 has vertical holes for inserting the electric feed rods 15, thermo couples 16a and 16b, and carbon heater 17. The connector casing 20 is cylindrical and has a flange 20a formed at the upper end. The flange 20a is sandwiched by the bottom lid 21 and the bottom wall of the exhaust chamber 3. A ring seal member 23a is disposed between the flange 20a and the bottom wall of the exhaust chamber 3 to seal this portion airtight. Two ring seal members 23b are disposed between the flange 20a and the bottom lid 21 to seal this portion airtight. Inside the connector casing 20, the electric feed rods 15 and carbon heater 17 are connected to electric feed lines 45 extending from the power supply 5, and the thermo couples 16a and 16b are connected to wiring lines 46 extending from the controller 7.

Next, an explanation will be given of a control system for the entire film forming apparatus 100.

The respective components of the film forming apparatus 100 are connected to and controlled by a process controller 60. The process controller 60 is connected to a user interface 61 including, e.g. a keyboard and a display, wherein the keyboard is used for a process operator to input commands for operating the film forming apparatus 100, and the display is used for showing visualized images of the operational status of the plasma processing apparatus 100.

Further, the process controller 60 is connected to a storage section 62 that stores control programs for the process controller 60 to control the film forming apparatus 100 so as to perform various processes, and programs or recipes for respective components of the film forming apparatus 100 to perform processes in accordance with process conditions. Recipes may be stored in a hard disk or semiconductor memory, or stored in a portable storage medium, such as a CDROM or DVD, to be attached to a predetermined position in the storage section 62. Further, recipes may be transmitted from another apparatus through, e.g., a dedicated line, as needed.

A required recipe is retrieved from the storage section 62 and executed by the process controller 60 in accordance with an instruction or the like through the user interface 61, as needed. Consequently, the film forming apparatus 100 can perform a predetermined process under the control of the process controller 60.

Figure 5:
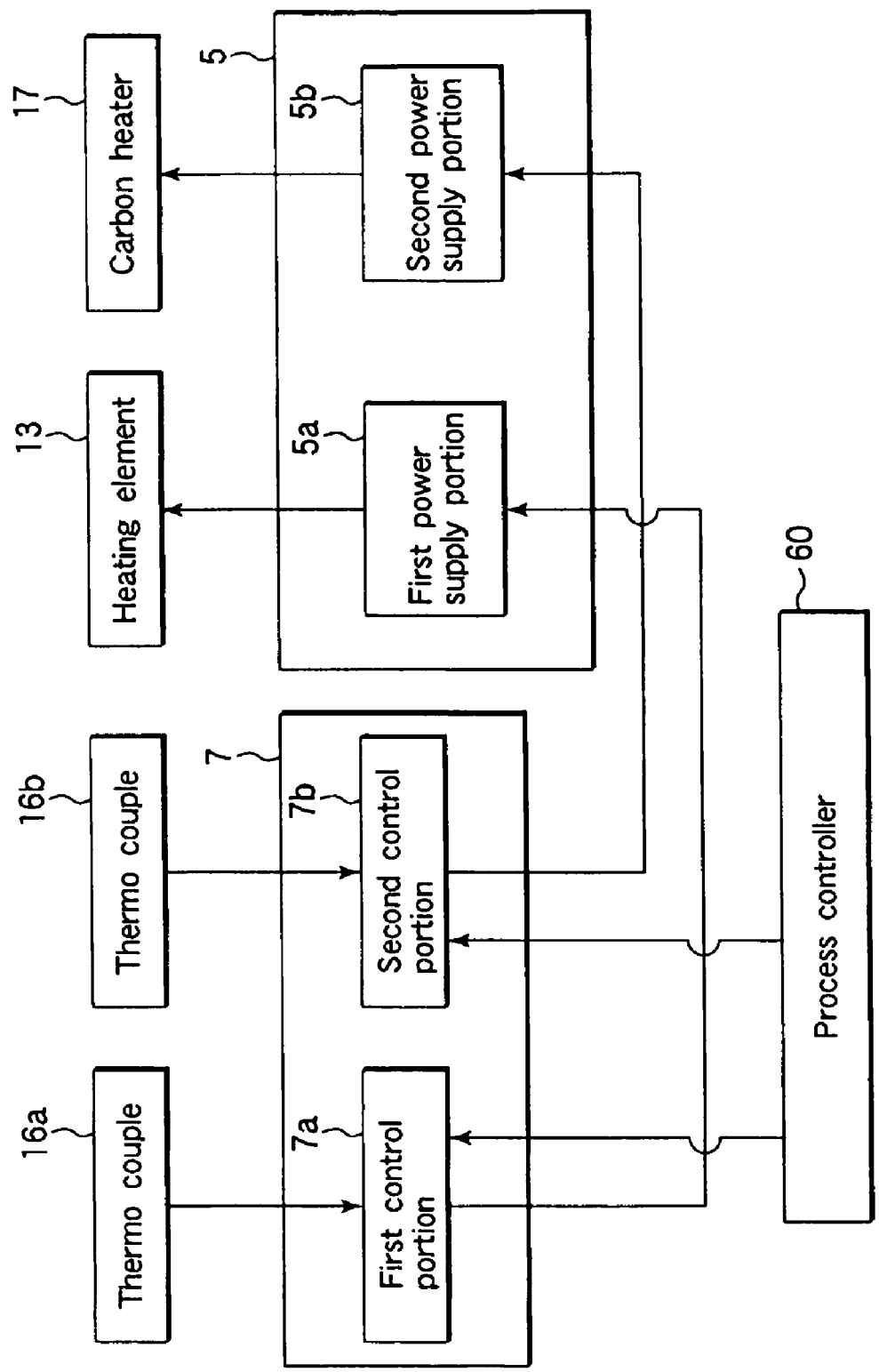
[FIG. 5] This is a block diagram showing an example of a control system of a heating element for heating a wafer table and a carbon heater for heating a support member in the wafer stage mechanism according to the embodiment of the present invention.

Next, an explanation will be given of a control system for the heating element 13 and carbon heater 17, with reference to FIG. 5. The controller 7 includes a first control portion 7a for controlling the temperature of the table 11, and a second control portion 7b for controlling the heating temperature of the carbon heater 17. The power supply 5 includes a first power supply portion 5a for feeding electricity to the heating element 13, and a second power supply portion 5b for feeding electricity to the carbon heater 17. The first control portion 7a and second control portion 7b are controlled by a process controller 60 serving as a host controller. The first control portion 7a is configured to receive detection signals from the thermo couple 16a and to transmit instructions to the first power supply portion 5a in accordance with the detection signals and instructions from the process controller 60, thereby controlling electric feed to the heating element 13. The second control portion 7b is configured to receive detection signals from the thermo couple 16b and to transmit instructions to the second power supply portion 5b in accordance with the detection signals and instructions from the process controller 60, thereby controlling electric feed to the carbon heater 17. The process controller 60 is configured to control the first control portion 7a and second control portion 7b, so that the carbon heater 17 heats an area near the junction between the wafer table 11 and support member 12 in accordance with the temperature of the wafer table 11.

The carbon heater 17 is conceived to thermally insulate the wafer table 11 and prevent cool spots from being generated, as described later, so the carbon heater 17 does not require precise control unlike the wafer table 11. Further, it is necessary to prevent the members inserted in the support member 12 from interfering with each other, as far as possible. In light of these matters, the temperature of the carbon heater 17 may be controlled by open loop control based on voltage, without use of the thermo couple 16b.

In the film forming apparatus 100 having the structure described above, at first, electricity is supplied to the heating element 13 embedded in the wafer table 11 from the first power supply portion 5a of the power supply 5, so that the wafer table 11 is heated to, e.g., about 700° C. Further, the interior of the process container 1 is exhausted by the exhaust unit 52 at full throttle. In this state, the gate valve 57 is opened, and a wafer W is transferred from the transfer chamber (not shown) in a vacuum state through the transfer port 56 into the chamber 2. After the wafer W is placed on the top of the wafer table 11, the gate valve 57 is closed. Then, film formation gases are supplied at predetermined flow rates from the gas supply mechanism 40 through the gas supply lines 35 and 36 into the showerhead 30. These gases are delivered from the showerhead 30 into the chamber 2, and caused to react with each other on the surface of the wafer W, thereby forming a predetermined film on the wafer W. For example, where $TiCl_4$ gas and $NH_3$ gas are used as the film formation gases, $TiCl_4$ gas and $NH_3$ gas react with each other on the surface of the wafer W on the wafer table 11, so that a TiN film is formed by thermal CVD.

Figure 6:
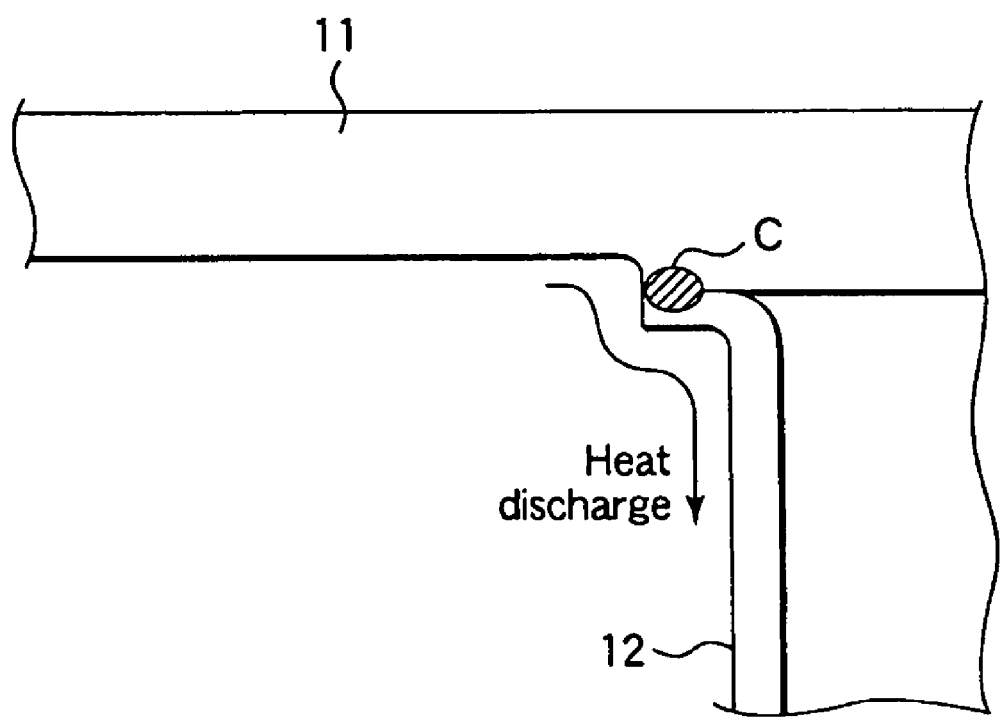
[FIG. 6] This is a view for explaining a state where a conventional wafer stage mechanism is used.

Conventionally, during such a film forming process, no heating is applied to the support member 12, and the following problems are thereby caused. Specifically, the upper end of the support member 12 is directly connected to the wafer table 11, and the lower end of the support member 12 is connected to the connector casing 20 having a bottom located on the atmospheric side, so heat is discharged by thermal conduction from the wafer table 11 through the support member 12 to the atmospheric side. Further, the support member 12 is connected to the central portion of the wafer table 11, at which electric feed terminals are present, so the density of the heating element cannot be increased at the central portion. Consequently, as shown in FIG. 6, cool spots C are generated around the junction between the wafer table 11 and support member 12, and thermal stress concentration occurs at these portions and brings about cracks near the junction with a considerable frequency. If the heating at the junction is enhanced by the heating element 13 to solve this problem, the central portion of a wafer, where the temperature tends to be higher, is enhanced, so the temperature distribution on the mount face of the wafer table 11 is less optimized.

On the other hand, according to the embodiment, the carbon heater 17 is disposed in the support member 12 as a heating device for heating the support member 12, so as to heat an area near the junction between the wafer table 11 and support member 12. Consequently, heat is prevented from being discharged from the wafer table 11 through the support member 12, so that no cool spots are formed. Further, the carbon heater 17 is configured to heat the support member 12 to remove cool spots independently of the heating of the wafer table 11. Consequently, the temperature of the wafer table 11 can be controlled by the heating element 13 to be optimum to the process.

The carbon heater 17 is disposed inside the support member 12 to heat an area near the junction between the wafer table 11 and support member 12 by radiant heat. In this case, the carbon heater 17 can be incorporated in the existing apparatus without entailing any change therein, so this incorporation can be easily realized. In order to remove the cool spots, a heater may be embedded in the support member 12. However, this countermeasure entails difficulty in manufacturing the support member 12 because the heater needs to be embedded in a thin plate portion. Further, thermal stress concentration may occur at a portion where the thickness is changed, and generate a crack therefrom. Accordingly, it is advantageous to adopt the structure according to the embodiment, in which the carbon heater 17 is disposed inside the support member 12 to heat the support member 12 by radiant heat.

In the carbon heater 17 used as a heating device, the quartz glass tube 41, quartz glass tube 43, and carbon wire 44 have high purity and contain essentially no impurity, so they can hardly generate contaminants, such as metal contaminants, as well as organic contaminants. Further, quartz glass making the outer shell of the carbon heater 17 can be easily processed so as to form such a shape that can be disposed inside the narrow space of the support member 12 without interference with the members inserted in the support member 12, and can realize uniform heating.

The heating temperature of the carbon heater 17 is not necessarily required to be the same as the temperature of the wafer table 11. Even where the heater 17 is set to perform heating to some extent, the thermal conduction from the wafer table 11 to the support member 12 is decreased, so that the thermal stress due to cool spots is suppressed. For example, where the temperature of the wafer table 11 is controlled at 700° C., a set temperature of 500° C. used in the carbon heater 17 is sufficiently effective. However, in order to enhance this effect, the temperature of the carbon heater 17 is preferably controlled such that the temperature near the junction becomes the same as the temperature of the wafer table 11.

The present invention is not limited to the embodiment described above, and it may be modified in various manners. For example, in the embodiment described above, the carbon heater serving as a heating device for the support member is disposed in a state in which it is bent up and down and circulated. In this respect, the carbon heater may be disposed in another state, such as a spiral state, as long as it can heat the area in need with predetermined uniformity.

The carbon heater is used as a heating device because it can be easily shaped for setting inside the support member. However, another heating device may be used, as long as it can be disposed inside the support member 12. Particularly, a halogen lamp is preferably usable, because it can perform heating at about 700° C. by radiant heat, involve few impurity, and provide a good heating efficiency. Where a halogen lamp is used, it is possible to use a structure essentially the same as that of the carbon heater shown in FIG. 3 including the quartz glass tube 43 and the carbon wire disposed therein as a heating element. Specifically, a structure for this modification may include a quartz glass tube and a heating element disposed therein, such as a tungsten filament, wherein the filament may be bent in the shape shown in FIG. 2 or in another arbitrary shape.

As the type of heating device, heating by thermal conduction may be used in place of the heating by radiant heat described above. A heating device of the type that provides heating by thermal conduction is exemplified by a resistance heating heater. Where a resistance heating heater is used, it is possible to use a structure essentially the same as that shown in FIG. 3, which includes a quartz tube and a heating element disposed therein. In this case, the heating element may be formed of a resistance heating element made of a refractory metal, such as tungsten, and bent in the shape shown in FIG. 2 or in another arbitrary shape. In place of a quartz tube, a tube made of a metal, such as Ni, stainless steel, or HASTELLOY™, may be used. As a resistance heating heater, a heating element of a refractory metal wire bent in an arbitrary shape may be used.

In the embodiment described above, a heating device for heating the support member is disposed inside the support member. In this respect, a heating device for this purpose may be disposed outside the support member if the process atmosphere is less corrosive. Alternatively, depending on the shape of the support member, a heating device for this purpose may be embedded in the support member. However, a heating device for this purpose is preferably disposed inside the support member as in the embodiment, because setting thereof is easy and consideration for corrosion is not required.

In the embodiment described above, the support member is connected to the wafer table essentially at the center. Alternatively, for example, a plurality of support members may be connected to the peripheral portion of the wafer table, so that the same effect is attained.

In the embodiment described above, the substrate stage mechanism according to the present invention is applied to a CVD film forming apparatus. However, the substrate stage mechanism is applicable to any processing apparatus that heats and processes a substrate. The target substrate is not limited to a semiconductor wafer, and it may be another substrate, such as that of a flat panel display, a representative of which is a liquid crystal display.

INDUSTRIAL APPLICABILITY

The present invention is widely usable for heating processes, such as thermal CVD, performed on a substrate by use of a substrate stage mechanism, which includes a substrate table configured to place the substrate thereon inside a chamber and supported by a support member.

The invention claimed is:

1. A substrate stage mechanism configured to place a substrate thereon inside a process container of a substrate processing apparatus and having a substrate heating function for heating the substrate, the substrate stage mechanism comprising:
a substrate table including a table base body configured to place the substrate on an upper surface of the table base body and a table heating element provided to the table base body and configured to heat the substrate;
a tubular support member having one end connected to a lower surface of the table base body and another end attached to the process container; and
a heating device disposed inside the support member and configured to heat a junction between the substrate table and the support member, wherein
the heating device includes a sheath tube and a heat generation line contained in the sheath tube, and
the sheath tube with the heat generation line is circulated along an inner surface of the support member at a position directly below the lower surface of table base body with a gap between the lower surface and the sheath tube.

2. The substrate stage mechanism according to claim 1, wherein the heating device is configured to heat the support member by radiation.

3. The substrate stage mechanism according to claim 2, wherein the heating device includes a quartz glass tube serving as the sheath tube and a carbon wire serving as the heat generation line.

4. The substrate stage mechanism according to claim 2, wherein the heating device is a halogen lamp that includes a quartz glass tube serving as the sheath tube and a filament serving as the heat generation line.

5. The substrate stage mechanism according to claim 1, wherein the heating device is configured to heat the support member by thermal conduction.

6. The substrate stage mechanism according to claim 5, wherein the heating device is a resistance heating heater.

7. The substrate stage mechanism according to claim 1, wherein the support member is connected to a central portion of the substrate table.

8. The substrate stage mechanism according to claim 1, wherein the substrate stage mechanism further comprises a control device configured to control the heating device to heat the junction in accordance with a temperature of the substrate table.

9. The substrate stage mechanism according to claim 1, wherein the sheath tube with the heat generation line of the heating device is circulated while being bent up and down.

10. The substrate stage mechanism according to claim 1, wherein
the heat generation line of the heating device is configured to electrically generate heat, and
the substrate stage mechanism further includes a heating device electric feed line extending inside the support member to feed electricity to the heat generation line from outside the process container.

11. The substrate stage mechanism according to claim 1, wherein
the table heating element is configured to electrically generate heat,
the substrate stage mechanism further includes a table electric feed line extending inside the support member to feed electricity to the table heating element from outside the process container, and
the sheath tube with the heat generation line of the heating device is circulated around the table electric feed line.

12. A substrate processing apparatus comprising:
a process container configured to accommodate a substrate and hold a vacuum pressure therein;
a substrate stage mechanism disposed inside the process container and configured to place the substrate thereon; and
a process mechanism configured to perform a predetermined process on the substrate inside the process container, wherein
the substrate stage mechanism comprises
a substrate table including a table base body configured to place the substrate on an upper surface of the table base body and a table heating element provided to the table base body and configured to heat the substrate,
a tubular support member having one end connected to a lower surface of the table base body and another end attached to the process container, and
a heating device disposed inside the support member and configured to heat a junction between the substrate table and the support member, wherein
the heating device includes a sheath tube and a heat generation line contained in the sheath tube, and
the sheath tube with the heat generation line is circulated along an inner surface of the support member at a position directly below the lower surface of the table base body with a gap between the lower surface and the sheath tube.

13. The substrate processing apparatus according to claim 12, wherein the heating device of the substrate stage mechanism is configured to heat the support member by radiation.

14. The substrate processing apparatus according to claim 13, wherein the heating device includes a quartz glass tube serving as the sheath tube and a carbon wire serving as the heat generation line.

15. The substrate processing apparatus according to claim 13, wherein the heating device is a halogen lamp that includes a quartz glass tube serving as the sheath tube and a filament serving as the heat generation line.

16. The substrate processing apparatus according to claim 12, wherein the heating device of the substrate stage mechanism is configured to heat the support member by thermal conduction.

17. The substrate processing apparatus according to claim 16, wherein the heating device is a resistance heating heater.

18. The substrate processing apparatus according to claim 12, wherein the support member of the substrate stage mechanism is connected to a central portion of the substrate table.

19. The substrate processing apparatus according to claim 12, wherein the substrate stage mechanism further comprises a control device configured to control the heating device of the substrate stage mechanism to heat the junction in accordance with a temperature of the substrate table.

20. The substrate processing apparatus according to claim 12, wherein the sheath tube with the heat generation line of the heating device is circulated while being bent up and down.

* * * * *